(12) United States Patent
Wu et al.

(10) Patent No.: US 8,198,118 B2
(45) Date of Patent: Jun. 12, 2012

(54) METHOD FOR FORMING A ROBUST MASK WITH REDUCED LIGHT SCATTERING

(75) Inventors: Ken Wu, Jhubei (TW); Hung-Chang Hsieh, Hsin-Chu (TW); Chang-Cheng Hung, Jubei (TW); Luke Hsu, Hsinchu (TW); Ren-Guey Hsieh, Baoshan Township, Hsinchu County (TW); Hsin-Chang Lee, Zhubei (TW); Chia-Jen Chen, Jhudong Township, Hsinchu County (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 578 days.

(21) Appl. No.: 11/590,257

(22) Filed: Oct. 31, 2006

(65) Prior Publication Data
US 2008/0102379 A1    May 1, 2008

(51) Int. Cl.
*H01L 21/31* (2006.01)
*H01L 33/44* (2010.01)
*G03F 1/00* (2012.01)
*G03F 9/00* (2006.01)

(52) U.S. Cl. .................. 438/69; 438/24
(58) Field of Classification Search .......... 438/31, 438/32, 487
See application file for complete search history.

(56) References Cited

U.S. PATENT DOCUMENTS

| | | | |
|---|---|---|---|
| 6,472,107 B1* | 10/2002 | Chan | 430/5 |
| 7,179,567 B2* | 2/2007 | Inazuki et al. | 430/5 |
| 7,365,014 B2* | 4/2008 | Bencher et al. | 438/700 |
| 2007/0190459 A1* | 8/2007 | Hashimoto et al. | 430/270.1 |

* cited by examiner

*Primary Examiner* — Kiesha Bryant
*Assistant Examiner* — Pamela E Perkins

(57) ABSTRACT

A mask and method for forming the same including carrying out a photolithographic patterning process the method including providing a substantially light transparent portion; forming a substantially light shielding layer disposed over the substantially light transparent portion; forming at least one barrier layer disposed over the substantially light shielding layer; forming a resist layer disposed over the at least one barrier layer; patterning the resist layer for producing a circuitry pattern; and, carrying out an etching process according to the circuitry pattern to expose a portion of the substantially light transparent portion to form a mask.

20 Claims, 4 Drawing Sheets

METHOD FOR FORMING A ROBUST MASK WITH REDUCED LIGHT SCATTERING

FIELD OF THE INVENTION

This invention generally relates to photomask patterning in a micro-integrated circuit manufacturing process and more particularly to a mask and method for forming the same including improved mask CD uniformity, mask robustness, and reduced scattered light from the mask during a photolithographic patterning process.

BACKGROUND OF THE INVENTION

In semiconductor device manufacturing, photolithography is typically used to transfer a pattern for forming semiconductor features onto the semiconductor wafer for the formation of multi-layered structures forming integrated circuits. During a photolithographic process, radiant energy having relatively small wavelengths such as ultraviolet light is passed through a photomask also referred to as a reticle to expose a radiant energy sensitive material such as photoresist formed on the wafer process surface. The mask includes predetermined circuitry patterns having attenuating regions and non-attenuating regions where the radiant energy intensity is modulated. For example, Ultraviolet (UV) light passed through the photomask onto the photoresist causes chemical reactions in the exposed portion of the photoresist altering it properties. Upon development of the photoresist resist exposed portions are removed in the case of a positive photoresist and non-exposed portions are removed in the case of a negative photoresist forming a pattern for subsequent processes such as anisotropic etching.

As semiconductor device feature sizes have decreased to sizes smaller than the wavelength of light used in photolithographic processes, the stray light incident on the exposed photoresist has increasingly become a problem in forming features with small critical dimensions (CDs), for example less than about 0.25 microns. Scattered light from undesired sources can cause a loss of pattern resolution in transferring the reticle pattern to the wafer photoresist. To increase the resolution of a transferred photolithographic pattern, phase shift masks (PSMs) have been developed where the phase of the wavefronts of light passing through alternating portions of the reticle pattern are shifted out of phase with respect to light passing through adjacent portions to produce destructively interfering wavefronts thereby reducing undesired exposure of the wafer photoresist due to diffraction of light at feature edges of the recticle pattern. As a result, the contrast, and therefore transferable resolution of the reticle pattern is improved.

There have been several different types of masks developed to improve resolution for different types of reticle patterns. For example, in an attenuated or halftone phase shift mask, the phase shifting function is typically accomplished by adding an extra layer of transmissive material to the mask with predetermined optical properties. Some PSMs are designed to produce improved resolution while having little improvement in depth of focus, while other PSMs are designed to have relatively modest increases in resolution while producing a greater improvement in depth of focus. For example, attenuated PSMs, also referred to as halftone PSMs, are of the latter type.

In a conventional mask, an opaque layer is formed which is not transmissive to light. Metals such as chromium are frequently used to form the opaque layer. The opaque layer is typically photolithographically patterned and etched, for example using an E-beam, laser or conventional UV light source to pattern a resist layer followed by etching to form a circuitry pattern including lines, pads, and contact holes.

For example, in the exposure process a mask formed on what is referred to as a reticle is repeatedly used to expose the circuit pattern on the reticle onto the photoresist covered process wafer. Typically, the term mask and reticle are now interchangeably used, although a photomask in the past has typically been used to refer to a mask that contains the pattern image for a complete wafer die array. Masks used in modern technology are typically referred to as reticles as well as masks where the reticle includes one or more mask patterns for individually patterning wafer die. In modern photolithography practice, a step and repeat process, such as step and scan, is used to expose the wafer surface with light passed through the mask over multiple wafer die. The mask on the reticle is larger by a factor of about 4 to 5 and is reduced to the appropriate dimensions on the wafer surface by optical reduction methods. For example, in the exposure process, the mask is illuminated by a light source either centered on the centerline of the projection optics or at an angle to the centerline of the projection optics, referred to as off-axis illumination to reduce the resolution limit and increase the depth of focus.

One problem with prior art processes is the presence of scattered light present during the exposure process. Scattered light present in the exposure process can alter a carefully designed exposure of the photoresist. For example, the light dose in an exposure process is critical for appropriate exposure of the photoresist to achieve desired pattern feature resolution, also referred to as critical dimension (CD), in the photoresist development process. Scattered light present in the exposure process can reduce the effectiveness of phase shift masks designed to reduce the effect of light diffraction around feature edges in the mask.

Prior art processes have attempted reduce scattered light by the use of pellicle film, a thin layer of flexible and optically transparent material including anti-reflective properties that is tightly stretched on a frame about 5 mm to about 10 mm above the surface of the reticle. This configuration is not useful in many exposure processes, for example DUV exposure processes where the pellicle film may not be sufficiently transparent or may be degraded after repeated exposure.

Another shortcoming in the prior art relates to the thickness of the photoresist layer typically required to successfully etch PSMs, due to less than desirable selectivity in the etching process to the underlying PSM. As a result, as device sizes decrease it is difficult to achieve the desired CD even in the absence of undesired light reflections, as well as being affected in the exposure process by considerations of insufficient depth of focus.

Thus, there is a need in the semiconductor manufacturing art for an improved method and mask to reduce light scattering in a photolithographic exposure process while increasing an etching selectivity in a PSM etching process to improve critical dimension uniformity.

It is therefore among the objects of the present invention to provide an improved method and mask to reduce light scattering in a photolithographic exposure process while increasing an etching selectivity in a PSM etching process to improve critical dimension uniformity, in addition to overcoming other shortcomings and deficiencies of the prior art.

SUMMARY OF THE INVENTION

To achieve the foregoing and other objects, and in accordance with the purposes of the present invention, as embodied and broadly described herein, the present invention provides a mask and method for forming the same including carrying out a photolithographic patterning process.

In a first embodiment, the method includes providing a substantially light transparent portion; forming a substantially light shielding layer disposed over the substantially light transparent portion; forming at least one barrier layer disposed over the substantially light shielding layer; forming a resist layer disposed over the at least one barrier layer; patterning the resist layer for producing a circuitry pattern; and, carrying out an etching process according to the circuitry pattern to expose a portion of the substantially light transparent portion to form a mask.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to the formation of an exemplary mask (photomask), it will be appreciated that the method of the present invention may likewise be applied to any type of mask having a light reflective surface facing a process wafer surface in a photolithographic patterning process. It will be appreciated that the terms "mask" or "photomask" refers both to masks for patterning an entire wafer and reticles for patterning one or more wafer die in a photolithographic patterning process. For example the photomask (mask) may additionally include alternating phase shift portions, partially absorptive phase shift mask portions, and rim phase shifter and blocking portions.

In one embodiment of the invention, a substantially light transparent (e.g., transmitting) substrate, preferably quartz, is provided having at least an uppermost substantially light shielding layer, formed over the light transparent substrate forming an uppermost mask layer. For example by the term substantially light shielding is meant that less than about 10%, preferable less than about 1% including substantially no incident light is transmitted. The surface of the uppermost substantially light shielding film is preferably at least partially reflective. At least one barrier layer, preferably serving at least one of the functions of acting as a bottom anti-reflective coating (ARC or BARC) and an etching hard mask, more preferably serving both functions, is then provided over the uppermost mask layer.

A phase shifting layer (PSL) may be formed between the substantially light blocking layer and the light transmitting substrate. The PSL preferably is formed to transmit less than about 20% of incident light and produce a phase shift of about 180 degrees with respect to transmitted light (light transmitted through the light transparent substrate).

A photosensitive layer, for example a resist layer is then applied over the at least one barrier layer and a patterning and etching process, for example a dry etching process, is then carried out to first etch through a thickness of an exposed portion of the barrier layer followed by optionally removing the resist layer to carry out subsequent etching processes using the barrier layer as a etching hardmask. A series of dry etching processes are then carried out to expose portions of the light transparent substrate, followed by removing the resist layer if still present, to form a mask circuitry pattern. At least a portion of the barrier layer (e.g., stack), is preferably left in place for subsequent use in a process wafer photolithographic patterning process whereby the barrier layer retains anti-reflective properties to attenuate incident light back reflected light from a process wafer surface to reduce or avoid back-scattering light onto the process wafer surface.

Figure 1A:
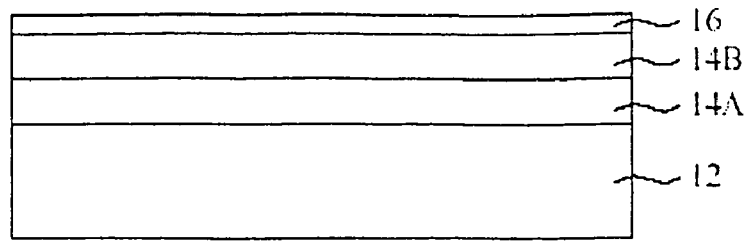
FIGS. 1A through 1E are cross sectional views of a portion of a photomask substrate at stages in production of a photomask according to an embodiment of the present invention.

Referring to FIG. 1A, in an exemplary embodiment, are shown cross sectional views of a portion of a mask substrate at stages in an exemplary mask manufacturing process. Referring to FIG. 1A is shown light transmitting (substantially transparent) substrate 12, preferably formed of fused silica, also referred to as quartz. Formed overlying the light transmitting substrate 12 is optionally and preferably formed a phase shift layer (PSL) 14A. The PSL layer 14A is formed to be partially light transmissive, shifting of the phase of light transmitted through the PSL to be about 180 degrees out of phase with respect to light passing only through the light transmitting substrate 12 in a completed mask. Preferably, the PSL is formed to transmit less than about 20% of incident light. Preferably, the PSL (which may be formed of stacked layers) is formed of at least one of Mo, $Mo_xSi_y$ (e.g., MoSi), $MoSi_xN_y$ (e.g., MoSiN), and $MoSiO_yN_z$ (e.g., MoSiON). The PSL is formed according to conventional methods including one or more of PVD, CVD, PECVD, and LPCVD deposition methods and is formed at a thickness depending on the desired phase shifting properties and the wavelength of incident light as is known in the art.

Still referring to FIG. 1A, following formation of the PSL 14A, a substantially light shielding layer 14B is formed overlying the PSL 14A, preferably formed of a light blocking material sufficient in thickness to block greater than about 90%, more preferably greater than about 99% of the incident light from passing through the substantially light shielding layer. The substantially light shielding layer preferably comprises chromium (Cr), but may include other layers such as Cr, $CrO_xN_y$, and $CrN_x$, and $Cr_2O_3$. It will be appreciated that the substantially light shielding layer 14B may include stacked layers for example a Cr layer formed over a glue layer (not shown) as is known in the art. The overall thickness of the substantially light shielding layer 14B will depend on the desired light transmitting characteristic and etching rate in a subsequent dry etching process as explained further below. Typically the thickness of the substantially light shielding layer 14B is in the range of about 500 Angstroms to about 1500 Angstroms, and may be formed by conventional CVD, PECVD, or PVD deposition methods.

For example, the uppermost substantially light shielding layer 14B reflects greater than about 8 percent of the incident light on the uppermost layer at an air/uppermost layer interface, for example a light wave front reflecting from a process wafer surface during mask illumination through the backside of a completed mask used in a photolithographic exposure process.

Still referring to FIG. 1A, at least one barrier layer e.g., 16 is formed over the uppermost mask layer, e.g., substantially light shielding layer 14B by conventional deposition processes. For example the at least one barrier layer preferably includes light attenuating material, either organic or inorganic, to reduce back reflected light from the mask surface when the completed mask is used in a process wafer patterning process. The at least one barrier layer may also be formed to perform the function of an etching hard mask and is preferably formed to have both anti-reflective and hardmask properties (low etching rate in a dry etching process).

The light attenuating characteristics of the barrier layer may be primarily light absorbing or primarily light attenuating by destructive interference principles also referred to as index (refractive index) matching. For example, the thickness of at least one of the at least one barrier layer (e.g., inorganic stack) is formed at thickness of about ¼ of the wavelength ($\lambda$) of light used in a subsequent process wafer photolithographic patterning process. In addition, the at least one barrier layer may include light absorbing characteristics, for example, absorbing dyes present in organic portions of the at least one barrier layer. For example, an organic barrier layer may be formed of a resin, including a cross-linking agent for hardening the resin. Optionally, the resin may include a light absorbing dye as are known in the art.

Several inorganic materials may be suitably used for the barrier layer 16. For example, silicon oxide, silicon nitride, and silicon carbide may be used to form the barrier layer or barrier layer stack. More preferably, the barrier layer (e.g., stack) is formed of a material that functions both as an ARC and as a hard mask, for example including silicon oxynitride. For example, the barrier layer 16 is formed of at least one layer including silicon oxynitride (e.g., $SiO_xN_y$) which may be tuned to have a desired refractive index and extinction coefficient by altering the relative amount of constituents, including silicon, oxygen and nitrogen in a PECVD process as is known in the art. For example, the extinction coefficient may be varied over a broad range. Preferably, the uppermost layer of the at least one barrier layer e.g., 16 has an extinction coefficient between about 0.2 and about 0.8, more preferably about 0.3 and about 0.5 to reduce back-scattered light from the mask when used in a photolithographic patterning process. Other types of suitable inorganic barrier layers include silicon carbide (SiC), silicon oxycarbide (e.g., SiOC), and titanium nitride (e.g., TiN), although TiN is not a preferred uppermost barrier layer for use in a DUV (e.g., less than about 250 nm) photolithographic exposure process due to its relatively high reflectivity at DUV wavelengths.

Another material that is preferred for use in the barrier layer or barrier layer stack is a silicide layer, for example TiSiN, MoSi, and MoSiON. These materials are primarily beneficial as a hard mask and may optionally be formed over an underlying inorganic barrier layer which has superior anti-reflective properties. For example, in this embodiment, the silicide layer may formed of a material having etch rates similar to the PSL and is preferably formed at a thickness such that it is removed during dry etching through a thickness of the PSL layer to leave an underlying ARC layer. For example, following the mask etching process an underlying anti-reflective layer e.g., SiON, is left remaining over the substantially light shielding portions of the mask following mask formation to reduce back-scattered light reflections in a subsequent wafer patterning process. An added advantage of using an uppermost silicide layer is that a relatively thin layer e.g., less than about 1000 Angstroms may be used as an etching hard mask. Consequently, as shown below a thinner resist layer may be used to pattern and etch the silicide layer thereby improving CD uniformity in the mask formation process.

Generally an inorganic barrier layer, forming at least an uppermost layer of a barrier layer stack, is generally preferred since the uniformity of deposition processes frequently provides superior ARC properties, especially at DUV wavelengths. In addition, an inorganic barrier layer (e.g., stack) is generally preferred since they are readily left in place, are resistant to photoresist developer, and provide a hard mask in a dry etching process to improve CD control in the mask etching process. In contrast, organic barrier layers which are applied by a spin coating process and are more difficult to form reliably at $\lambda$/4 thicknesses, and rely on the presence of an absorbing dye to accomplish the anti-reflective function.

Organic barrier layers are suitably formed by a spin-coating process and include at least a resin component, a dye component, and a crosslinking agent. In addition, the organic barrier layer may include silane containing compounds included in a thermosetting resin matrix as is known in the art. The organic barrier layer e.g. 16, is preferably resistant to the developer used to develop an overlying resist layer and compatible with the overlying resist, for example E-beam, DUV, or I-line resists, and preferably etchable by conventional dry or wet etching chemistries, more preferably a dry etching process.

In addition, an organic layer may be formed over an inorganic layer to form a barrier layer stack with the underlying inorganic layer formed to operate according to primarily index matching principals and the overlying organic layer formed to operate primarily according to light absorbing principals. In this case, an inorganic layer with some surface reflectivity may used (e.g., TiN) with surface reflectance absorbed by the overlying organic layer. In addition, the underlying inorganic layer may be advantageously used as a hardmask during the etching process to form the mask.

Figure 1B:
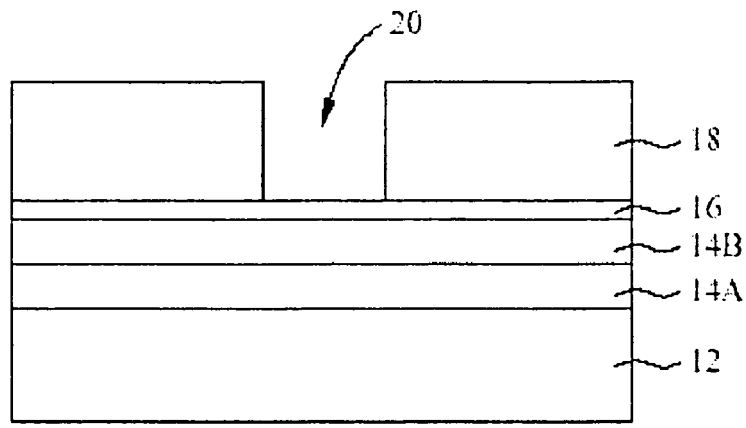

Referring to FIG. 1B, following formation of the at least one barrier layer e.g., 16, a resist layer 18 is patterned and developed by conventional processes, for example using an E-beam, laser, DUV or UV light source to expose the resist followed by a resist development process to form an etching opening pattern e.g., 20 to reveal portions of the underlying barrier layer e.g., 16 for etching a circuitry feature pattern in the barrier layer e.g., 16 and underlying mask layers e.g., 14A and 14B.

Figure 1C:
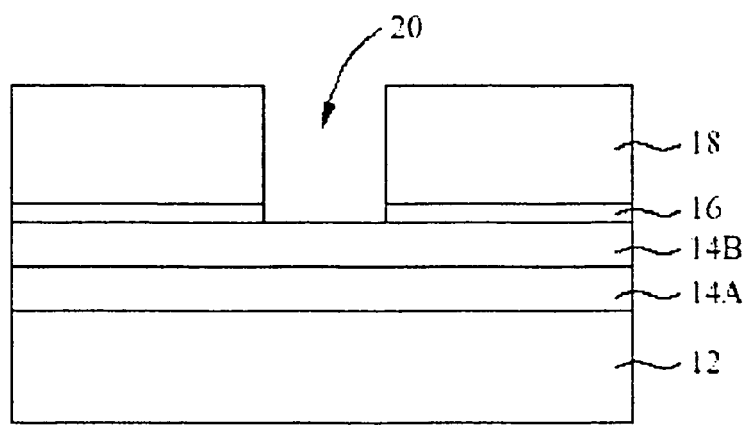

Referring to FIG. 1C, in an exemplary process including an exemplary barrier layer stack for forming the mask, a first conventional etching step is carried out to etch through the thickness portion of the at least one barrier layer e.g., 16, for example including an upper most silicide layer and an underlying anti-reflective layer according to circuitry pattern opening 20.

Figure 1D:
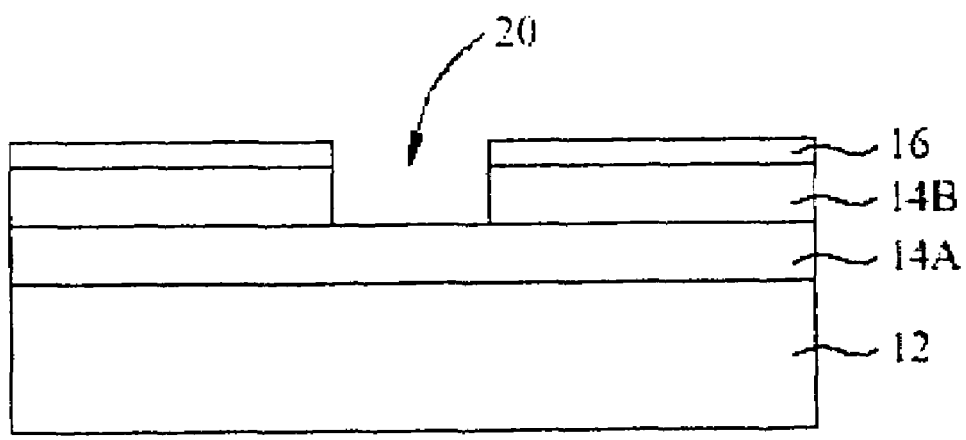

Referring to FIG. 1D, following etching through the barrier layer stack 16, the photoresist layer 18 may be optionally removed, for example if the barrier layer includes an uppermost hardmask layer. For example, in the exemplary embodiment shown, the uppermost layer of the barrier layer stack includes a thin silicide layer, e.g., less than about 1000 Angstroms and having an etching rate similar to the PSL. A second conventional dry etching step is then carried out using the barrier layer stack 16 as an etching hardmask to etch through a thickness of the light shielding layer 14B to reveal a portion of the PSL 14A. For example, an etching chemistry including a chlorine and oxygen may be used to etch through a chromium (Cr) containing light shielding layer e.g., 14B.

Figure 1E:
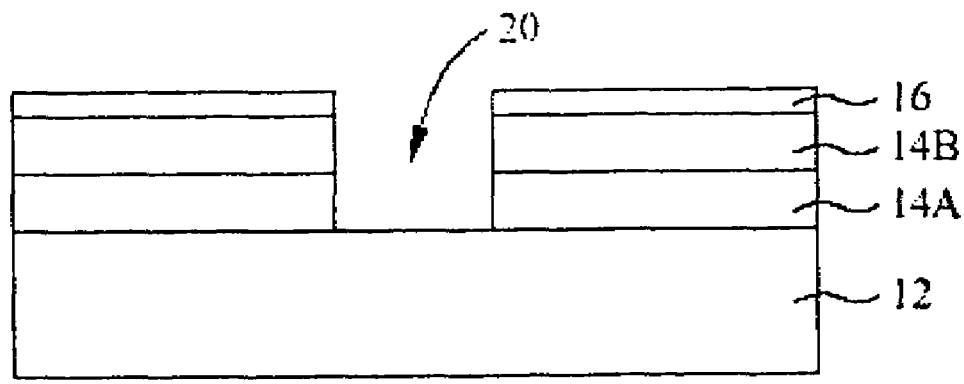

Referring to FIG. 1E, following etching through the light shielding layer 14B thickness, a conventional third etching step is carried out to etch through the PSL 14A thickness to reveal a portion of the light transmitting substrate 12 to complete formation of the circuitry opening pattern 20. For example, an etching chemistry including $SF_6$ or XeF may be used for etching a Molybdenum (Mo) containing layer. Preferably, the uppermost silicide layer portion of the barrier layer stack 16 is removed to reveal an underlying inorganic layer of the barrier layer stack (shown as a relatively thinner barrier layer stack 16) having anti-reflective properties, e.g., SiON.

It will be appreciated that portions of the light transmitting substrate 12 e.g., quartz may be selectively etched away at the bottom of opening 20 to attenuate transmitted light or a light attenuating material causing a phase shift of 180 degrees compared to light passing only through the light transmitting substrate may be subsequently deposited over selected alternating openings e.g., 20 to produce alternating phase shift masks (ALT PSM) as are known in the art.

Figure 2A:
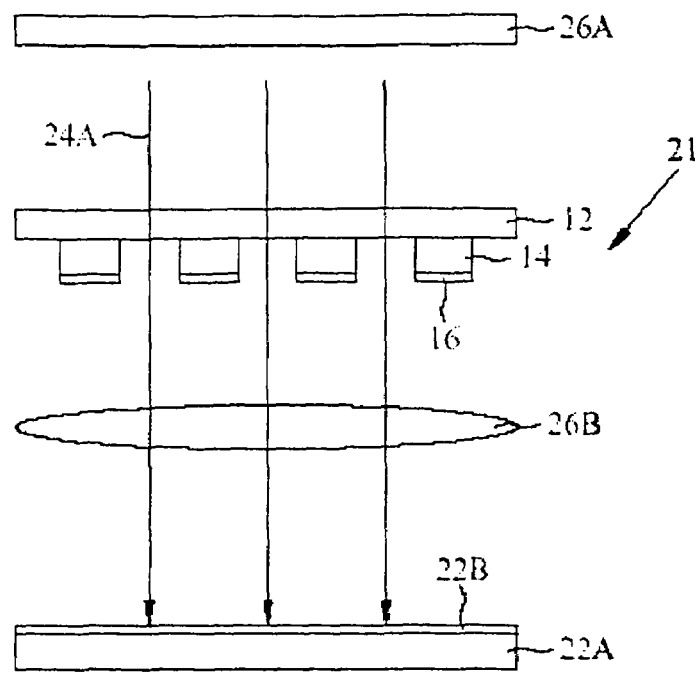
FIGS. 2A and 2B are schematic diagrams of exemplary operation and use of the photomask according to an embodiment of the invention.

Referring to FIG. 2A, a schematic representation of a completed mask 21 formed according to preferred embodiments is shown in exemplary operation. The mask (e.g., reticle) including the quartz substrate 12 with uppermost mask layer portions e.g., 14 covered by a barrier layer e.g., 16 is positioned in a conventional photolithographic exposure process with the barrier layer 16 facing a process wafer e.g., 22A having an uppermost layer of resist 22B. For example the process wafer is positioned substantially parallel with respect to the mask. A conventional step and scan apparatus with a conventional illumination source e.g., 26A and image reducing optics e.g., 26B positioned between the mask 21 and the process wafer 22A, may be used together with conventional alignment and optical proximity correction techniques to individually expose die portions of the process wafer. According to an aspect of the present invention, in operation, during the photolithographic exposure process light passes through the backside of quartz substrate 12 of mask 21 as indicated by directional arrows e.g., 24A and is partially absorbed by the photoresist layer 22B over the process wafer 22A.

Figure 2B:
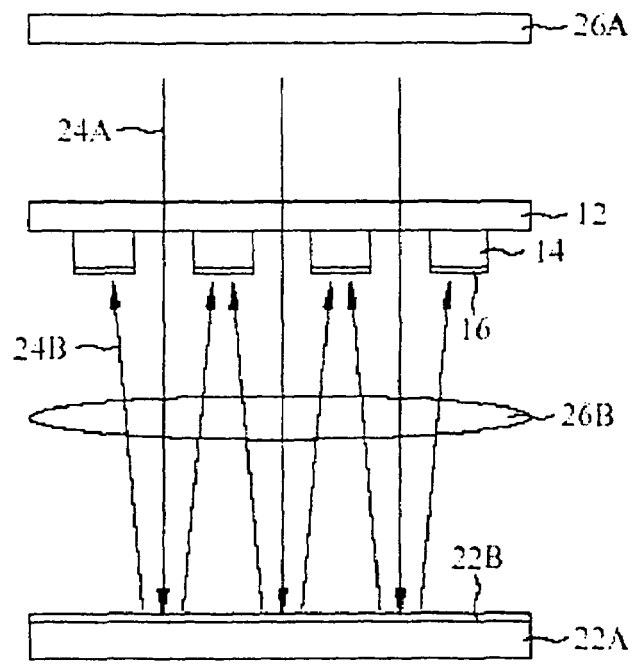

Referring to FIG. 2B, a portion of the light incident on the process wafer is reflected (scattered) off the process wafer, for example both the surface of the photoresist layer 22B the process wafer 22A surface with a portion of the reflected light e.g., directional arrow 24B, incident on the barrier layer e.g., 16 covering mask layer e.g., 14 portions (frontside). The barrier layer e.g., 16 preferably has anti-reflective properties, e.g., absorbing and/or attenuating at least greater than about 90% of the incident reflected light, more preferably substantially all (e.g., greater than about 99%) of the incident reflected light. As a result, back scattered light from the mask is advantageously avoided or reduced to avoid exposing unintended portions of the photoresist layer 22B.

Thus, a mask and method for carrying out a photolithographic patterning process has been developed to increase CD uniformity of the mask while producing a more robust back scattered light attenuating mask. For example, both the critical dimension uniformity of the mask is improved as well as improving the CD, including a resolution in a wafer patterning process using the mask formed according to embodiments of the present invention. Advantageously, by increasing the CD uniformity of the mask by employing a barrier layer serving a hardmask function while also serving an anti-reflective function a wafer photolithographic patterning process is improved. IN addition, the anti-reflective properties of the mask are more robust according to prior art methods and masks.

Figure 3:
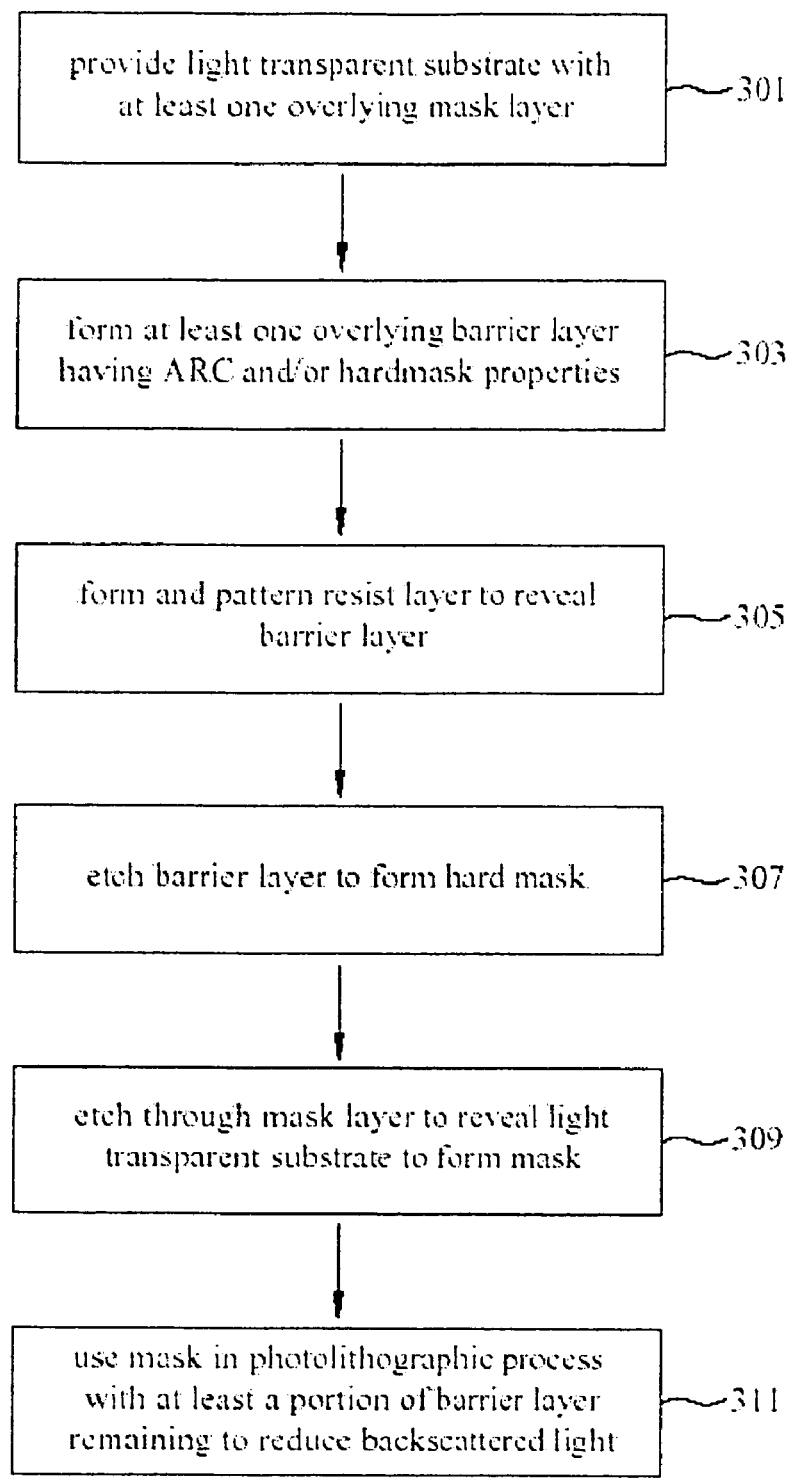
FIG. 3 is a process flow diagram including several embodiments of the present invention.

Referring to FIG. 3 is a process flow diagram including several embodiments of the present invention. In process 301, a light transparent substrate having at least one overlying mask layer including an uppermost light shielding layer is provided. In process 303, a barrier layer is formed over the light shielding layer according to preferred embodiments. In process 305 a resist layer is deposited over the substantially light shielding layer and lithographically patterned to reveal the barrier layer form a circuitry feature pattern. In process 307, the barrier layer is etched to form a hard mask according to the circuitry feature pattern. In process 309, an etching process is carried out using either the resist layer and/or the barrier layer as an etching mask to expose portions of the light transparent substrate to complete formation of the circuitry pattern (mask). In process 311, the mask is used with at least a portion of the barrier layer remaining and having anti-reflective properties to reduce back scattered light in a process wafer photolithographic patterning process.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A mask forming method comprising:
   providing a substantially light transparent portion;
   forming a phase shifting layer over the substantially light transparent portion;
   forming a substantially light shielding layer disposed over the phase shifting layer;
   forming at least one barrier layer deposited disposed over the substantially light shielding layer, an uppermost portion of said substantially light shielding layer not comprising anti-reflective properties, each barrier layer of said at least one barrier layer not comprising a Cr-based layer, said at least one barrier layer comprising an uppermost hardmask layer and an underlying anti-reflective layer;
   forming a resist layer disposed over the at least one barrier layer;
   patterning the resist layer for producing a circuitry pattern;
   carrying out an etching process according to the circuitry pattern to expose a portion of the substantially light transparent portion to form a mask; and
   wherein following the etching process at least a portion of the phase shifting layer, the light shielding layer and the at least one barrier layer having anti-reflective properties remains over portions of the light transparent portion.

2. The method of claim 1, wherein the etching process comprises a first etching step to etch through a thickness of the at least one barrier layer to expose a portion of the substantially light shielding layer.

3. The method of claim 2, wherein the etching process further comprises:
   removing the resist layer according to at least one of a wet stripping and ashing process; and,
   performing at least a second etching step wherein the at least one barrier layer functions as an etching hardmask.

4. The method of claim 3, wherein at least a portion of the at least one barrier layer is removed during the at least a second etching step.

5. The method of claim 1, wherein the hardmask layer has a thickness of less than about 1000 Angstroms.

6. The method of claim 1, wherein the at least one barrier layer comprises material selected from the group consisting of an organic and inorganic material.

7. The method of claim 1, wherein the at least one barrier layer includes inorganic material selected from the group consisting of silicon, oxygen, and nitrogen.

8. The method of claim 1, wherein the at least one barrier layer includes inorganic material selected from the group consisting of silicon oxide, silicon oxynitride, silicon nitride, silicon carbide, silicon oxycarbide, and titanium nitride.

9. The method of claim 1, wherein the at least one hardmask layer comprises a silicide layer.

10. The method of claim 9, wherein the silicide layer comprises material selected from the group consisting of TiSiN, MoSi, and MoSiON.

11. The method of claim 1, wherein the at least one barrier layer includes organic material including constituents selected from the group consisting of a resin, a cross-linking agent, and a light absorbing dye.

12. The method of claim 1, wherein the phase shifting layer comprises material selected from the group consisting of Mo, MoSi, MoSiN, and MoSiON.

13. The method of claim 1, wherein the phase shifting layer transmits less than about 20% of incident light.

14. The method of claim 1, wherein the phase shifting layer transmits incident light comprising a phase shift of about 180 degrees.

15. The method of claim 1, wherein the substantially light transparent portion consists essentially of quartz substrate.

16. The method of claim 1, wherein the substantially light shielding layer comprises chromium (Cr).

17. The method of claim 1, further comprising the steps of:
providing a substrate comprising an uppermost photosensitive layer;
positioning the mask with the at least one barrier layer substantially parallel in spaced apart relationship facing the photosensitive layer;
directing light through the mask onto the photosensitive layer; and,
developing the photosensitive layer to form a circuitry pattern.

18. The method of claim 17, wherein the photosensitive layer is selected from the group consisting of I-line and DUV photoresists.

19. The method of claim 17, wherein the wavelength of the light is less than about 365 nm.

20. The method of claim 17, wherein the wavelength of the light is less than about 250 nm.

* * * * *